(12) United States Patent
Tanaka et al.

(10) Patent No.: US 7,304,286 B2
(45) Date of Patent: Dec. 4, 2007

(54) SOLID-STATE IMAGING DEVICE, METHOD FOR MANUFACTURING THE SAME AND INTERLINE TRANSFER CCD IMAGE SENSOR

(75) Inventors: Syouji Tanaka, Ikoma (JP); Yoshiyuki Matsunaga, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 786 days.

(21) Appl. No.: 10/731,461

(22) Filed: Dec. 8, 2003

(65) Prior Publication Data

US 2004/0165092 A1 Aug. 26, 2004

(30) Foreign Application Priority Data

Feb. 21, 2003 (JP) .............................. 2003-044997

(51) Int. Cl.
*H04N 5/335* (2006.01)
(52) U.S. Cl. ................ 250/208.1; 250/214.1; 348/308
(58) Field of Classification Search ............. 250/208.1; 348/308; 438/60, 75
See application file for complete search history.

(56) References Cited

U.S. PATENT DOCUMENTS 5,151,380 A    9/1992   Hynecek
5,181,093 A    1/1993   Kawaura
6,504,193 B1   1/2003   Ishiwata et al.
6,570,201 B2   5/2003   Shim
6,767,312 B2   7/2004   Shim
2004/0165092 A1* 8/2004  Tanaka et al. .............. 348/308

FOREIGN PATENT DOCUMENTS

| EP | 0 457 192 | 5/1991 |
| JP | 2001-053260 | 2/2001 |
| JP | 2002-88881 | 11/2002 |

* cited by examiner

*Primary Examiner*—John R. Lee
(74) *Attorney, Agent, or Firm*—Hamre, Schumann, Mueller & Larson, P.C.

(57) ABSTRACT

A solid-state imaging device can be provided by which a signal charge stored in a photodiode can be transferred completely even when a power supply voltage is low. The solid-state imaging device includes: a plurality of pixel cells arranged on a semiconductor substrate; and a driving unit that is provided for driving the plurality of pixel cells. Each of the plurality of pixel cells includes: a photodiode that converts incident light into a signal charge and stores the signal charge; a transfer transistor that is provided for reading out the signal charge stored in the photodiode; and a potential smoothing unit that is formed so as to allow a potential from the photodiode to the transfer transistor to change smoothly.

24 Claims, 7 Drawing Sheets

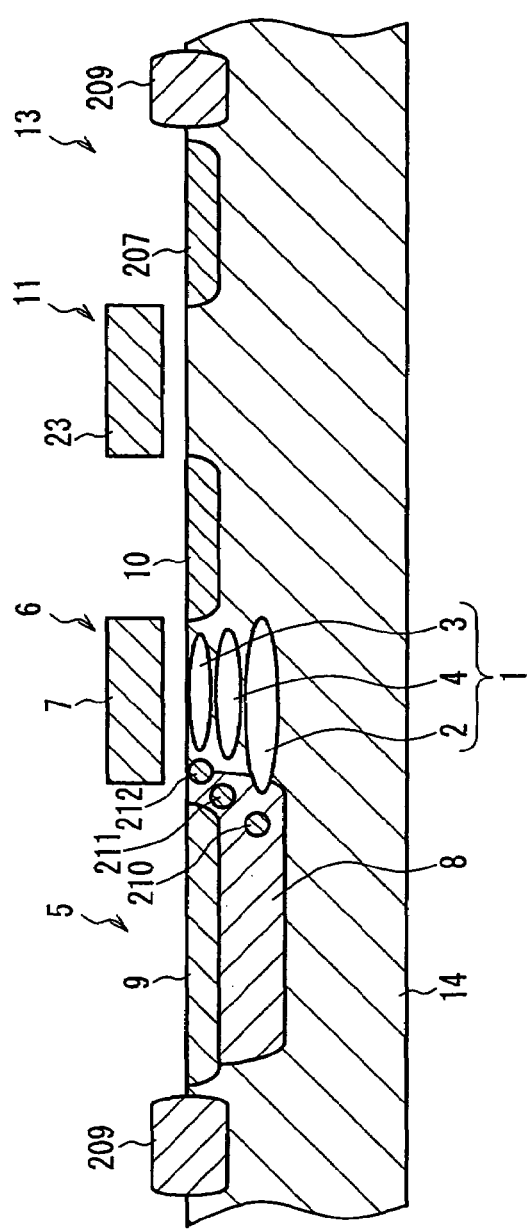
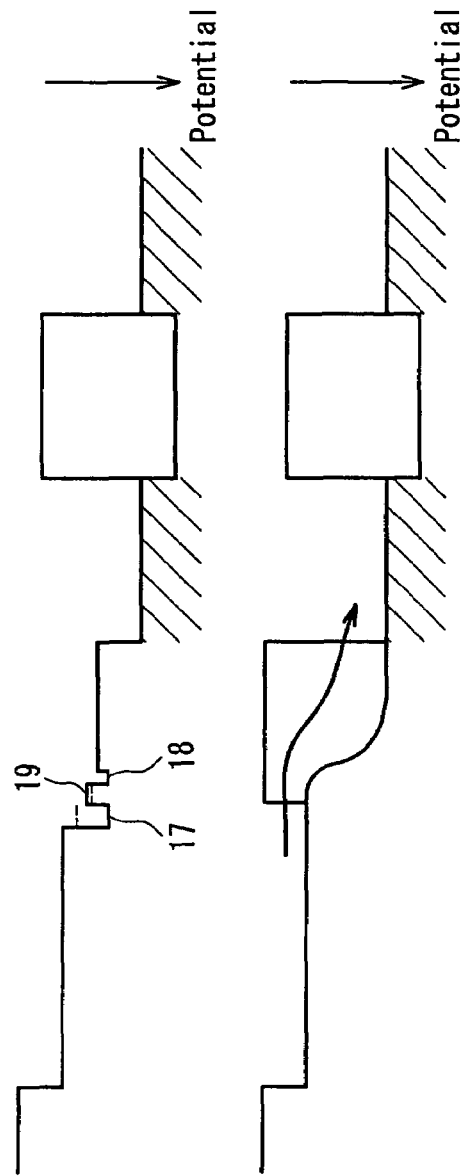
FIG. 2A
FIG. 2B
FIG. 2C

SOLID-STATE IMAGING DEVICE, METHOD FOR MANUFACTURING THE SAME AND INTERLINE TRANSFER CCD IMAGE SENSOR

BACKGROUND OF THE INVENTION

1. Field of the Invention

The present invention relates to a solid-state imaging device provided with an amplification-type MOS transistor and a method for manufacturing the same and relates to an interline transfer CCD image sensor.

2. Related Background Art

In recent years, attention has been drawn to a solid-state imaging device provided with an amplification-type MOS transistor. In this solid-state imaging device, for each pixel, a signal detected by a photodiode is amplified by a MOS transistor, and the device has a feature of high sensitivity.

FIG. 5 is a circuit diagram showing a configuration of a conventional solid-state imaging device 90. The solid-state imaging device 90 includes a plurality of pixel cells 13 arranged in a matrix form on a semiconductor substrate 14. Each of the pixel cells 13 includes a photodiode 95 that converts incident light into a signal charge and stores the signal charge. In each of the pixel cells 13, a transfer transistor 96 for reading out the signal charge stored in the photodiode 95 is provided.

Each of the pixel cells 13 includes an amplify transistor 12. The amplify transistor 12 amplifies the signal charge read out by the transfer transistor 96. In each of the pixel cells 13, a reset transistor 11 is provided. The reset transistor 11 resets the signal charge read out by the transfer transistor 96.

The solid-state imaging device 90 includes a vertical driving circuit 15. A plurality of reset transistor control lines 111 are connected to the vertical driving circuit 15. The reset transistor control lines 111 are arranged parallel with each other at predetermined intervals and along a horizontal direction so as to be connected to the reset transistors 11 that are respectively provided in the pixel cells 13 arranged along the horizontal direction. A plurality of vertical select transistor control lines 121 further are connected to the vertical driving circuit 15. The vertical select transistor control lines 121 are arranged parallel with each other at predetermined intervals and along the horizontal direction so as to be connected to vertical select transistors that are provided respectively in the pixel cells 13 arranged along the horizontal direction. The vertical select transistor control lines 121 determine a row from which a signal is to be read out.

A source of each vertical select transistor is connected to a vertical signal line 61. A load transistor group 27 is connected to one end of each vertical signal line 61. The other end of each vertical signal line 61 is connected to a row signal storing portion 28. The row signal storing portion 28 includes a switching transistor for capturing signals from one row. A horizontal driving circuit 16 is connected to the row signal storing portion 28.

FIG. 6 is a timing chart for explaining an operation of the conventional solid-state imaging device 90.

When a row selection pulse 101-1 is applied so as to make a level of a vertical select transistor control line 121 high, the vertical select transistors in the selected row turn ON, so that the amplify transistors 12 in the selected row and the load transistor group 27 form a source follower circuit.

While the row selection pulse 101-1 is at a high level, a reset pulse 102-1 for making a reset transistor control line 111 at a high level is applied so as to reset a potential of a floating diffusion layer to which a gate of each of the amplify transistors 12 is connected. Next, while the row selection pulse 101-1 is at the high level, a transfer pulse 103-1 is applied so as to make a level of transfer transistor control lines high, which allows a signal charge stored in each of the photodiodes 95 to be transferred to the floating diffusion layer.

At this time, each of the amplify transistors 12 connected to the floating diffusion layer has a gate voltage equal to the potential of the floating diffusion layer, which allows a voltage that is substantially equal to this gate voltage to appear across the vertical signal line 61. Then, a signal based on the signal charge stored in the photodiode 95 is transferred to the row signal storing portion 28.

Next, the horizontal driving circuit 16 sequentially generates column selection pulses 106-1-1, 106-1-2, . . . so as to extract the signals that have been transferred to the row signal storing portion 28 as an output signal 107-1 corresponding to those obtained from one row.

FIG. 7A is a cross-sectional view showing a configuration of the conventional solid-state imaging device 90, and FIG. 7B schematically shows a change in potential from a photodiode 95 to a transfer transistor 96 that are provided in the conventional solid-state imaging device 90.

The photodiode 95 is a buried-type pnp photodiode that includes a shallow p-type photodiode diffusion layer 99 formed at a surface of a semiconductor substrate 14 and a deep photodiode diffusion layer 98 formed below the shallow p-type photodiode diffusion layer 99 so as to be exposed partially from the surface of the semiconductor substrate 14.

The transfer transistor 96 is formed adjacent to the photodiode 95 and has a gate electrode 97 formed on the semiconductor substrate 14. At a portion of the surface of the semiconductor substrate 14 that is on an opposite side of the photodiode 95 with reference to the transfer transistor 96, a floating diffusion layer 10 is formed. At a portion of the surface of the semiconductor substrate 14 that is on an opposite side of the transfer transistor 96 with reference to the floating diffusion layer 10, a reset transistor 11 is formed so as to have a gate electrode 23. At a portion of the surface of the semiconductor substrate 14 that is on an opposite side of the floating diffusion layer 10 with reference to the reset transistor 11, a power-supply diffusion layer 207 is formed. An element isolation potion 209 is formed at each of the portions on an opposite side of the reset transistor 11 with reference to the power-supply diffusion layer 207 and on an opposite side of the transfer transistor 96 with reference to the photodiode 95.

In a portion of the semiconductor substrate 14 placed below the gate electrode 97 provided in the transfer transistor 96, a threshold value diffusion layer 208 for controlling a channel potential of the transfer transistor 96 is formed adjacent to the deep photodiode diffusion layer 98.

With reference to FIG. 7B, a power-supply voltage of the solid-state imaging device 90 is not less than 10 V. When the gate electrode 23 of the reset transistor 11 is turned ON, a potential of the floating diffusion layer 10 is fixed at the power-supply voltage. Then, when the gate electrode 23 of the reset transistor 11 is turned OFF, the potential of the floating diffusion layer 10 floats electrically.

Next, when the gate electrode 97 of the transfer transistor 96 is turned ON, a signal charge stored in the deep photodiode diffusion layer 98 of the photodiode 95 is introduced to the floating diffusion layer 10 through the threshold value diffusion layer 208 so as to be converted into a signal voltage. The signal voltage allows the modulation of a gate voltage of the amplify transistor 12 shown in FIG. 5 and is extracted to the outside by way of the vertical signal line 61, the row signal storing portion 28 and the horizontal driving circuit 16.

When the signal charge stored in the photodiode 95 is read out, ideally, all of the charge is read out completely so that the remaining signal charge in the photodiode 95 becomes zero. Such an ideal state is referred to as "complete transfer". The "complete transfer" may include some minor level of residual charge that is a residual state of, for example, about several tens of electrons.

The above-described conventional solid-state imaging device 90 enables the "complete transfer" to be carried out relatively easily, because the gate voltage of the transfer transistor 96 and the power-supply voltage are high at not less than 10 V.

However, in accordance with finer design rules adopted for MOS transistors, the gate voltage of the transfer transistor 96 and the power-supply voltage decrease to about 2.8 to 3.3 V. Therefore, it becomes significantly difficult to carry out the "complete transfer". The following describes such a problem specifically.

FIG. 7C schematically shows a change in potential from the photodiode 95 to the transfer transistor 96 that are provided in the conventional solid-state imaging device 90.

When the gate voltage of the transfer transistor 96 and the power-supply voltage are about 2.8 to 3.3 V, the potential from the photodiode 95 to the transfer transistor 96 does not change smoothly. The potential from the photodiode 95 to the transfer transistor 96 plunges at a first pocket 17. For instance, the potential does not change smoothly in such a manner that a potential of the first pocket 17 is 2 V, a potential of a barrier 19 is 1.7 V and a potential of a second pocket 18 is 2.1 V. This first pocket 17 occurs at a position 210 that corresponds to an edge of the shallow p-type photodiode diffusion layer 99. A depth of the position 210 where the first pocket 17 occurs is about 0.7 μm.

The potential from the photodiode 95 to the transfer transistor 96 further plunges at the second pocket 18 that is located on a side of the transfer transistor 96 with reference to the first pocket 17. The second pocket 18 occurs at a position 212 that is close to the surface of a portion of the deep photodiode diffusion layer 98 that is not covered with the shallow p-type photodiode diffusion layer 99. A depth of the position 212 where the second pocket 18 occurs is about 0.2 μm or less.

The potential from the photodiode 95 to the transfer transistor 96 has the barrier 19 formed between the first pocket 17 and the second pocket 18. This barrier 19 occurs at a position 211 that is located between the shallow p-type photodiode diffusion layer 99 and the threshold value diffusion layer 208. A depth of the position 211 where the barrier 19 occurs is about 0.4 μm or less.

In this way, when the gate voltage of the transfer transistor 96 and the power-supply voltage decrease to about 2.8 to 3.3 V, the first pocket 17, the second pocket 18 and the barrier 19 are formed. As a result, the potential from the photodiode 95 to the transfer transistor 96 does not change smoothly. For that reason, it becomes significantly difficult to carry out the "complete transfer" of the signal charge stored in the photodiode 95.

SUMMARY OF THE INVENTION

Therefore, with the foregoing in mind, it is an object of the present invention to provide a solid-state imaging device, a method for manufacturing the same and an interline transfer CCD image sensor, by which a signal charge stored in a photodiode can be transferred completely even when a power supply voltage is low.

A solid-state imaging device according to the present invention includes: a plurality of pixel cells arranged on a semiconductor substrate; and a driving unit that is provided for driving the plurality of pixel cells. Each of the plurality of pixel cells includes: a photodiode that converts incident light into a signal charge and stores the signal charge; a transfer transistor that is provided for reading out the signal charge stored in the photodiode; and a potential smoothing unit that is formed so as to allow a potential from the photodiode to the transfer transistor to change smoothly. Note here that to change smoothly refers to a change in which an abrupt change of a potential as shown in FIG. 7C, for example, does not occur.

A solid-state imaging device manufacturing method according to the present invention is a method for manufacturing the solid-state imaging device according to the present invention. The method includes the steps of: forming the potential smoothing unit for allowing a potential from the photodiode to the transfer transistor to change smoothly; forming the photodiode for converting the incident light into the signal charge and storing the signal charge, which is conducted after the step of forming the potential smoothing unit; and forming the transfer transistor for reading out the signal charge stored in the photodiode, which is conducted after the step of forming the photodiode. In the step of forming the potential smoothing unit, an impurity is implanted at a region between a region where the photodiode is to be formed and a region where the transfer transistor is to be formed, the injection being carried out using three different levels of energy.

An interline transfer CCD image sensor according to the present invention includes: a plurality of pixel cells arranged in a matrix form on a semiconductor substrate; and a driving unit that is provided for driving the plurality of pixel cells. Each of the plurality of pixel cells includes: a photodiode that converts incident light into a signal charge and stores the signal charge; a transfer gate that is provided for reading out the signal charge stored in the photodiode; and a potential smoothing unit that is formed so as to allow a potential from the photodiode to the transfer gate to change smoothly.

BRIEF DESCRIPTION OF THE DRAWINGS

FIG. 2A is a cross-sectional view showing a configuration of the solid-state imaging device according to this embodiment, and FIGS. 2B and 2C schematically show a change in potential from a photodiode to a transfer transistor, resulting from a potential smoothing layer provided in the solid-state imaging device according to this embodiment.

Figure 1:
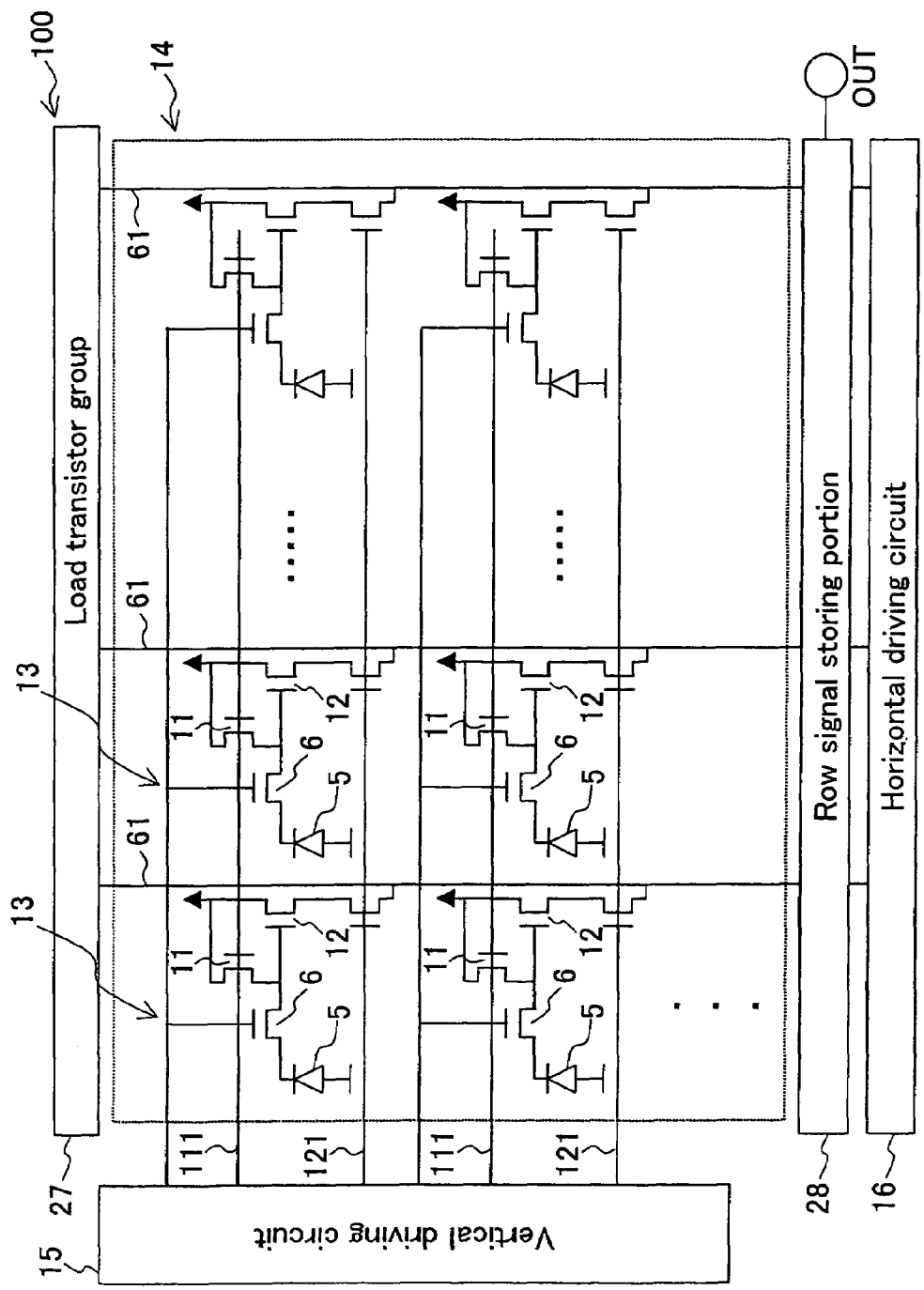
FIG. 1 is a circuit diagram showing a configuration of a solid-state imaging device according to the present embodiment.

7B and 7C schematically show a change in potential from a photodiode to a transfer transistor that are provided in the conventional solid-state imaging device.

DETAILED DESCRIPTION OF THE INVENTION

In the solid-state imaging device according to this embodiment, the potential smoothing unit allows a potential from the photodiode to the transfer transistor to change smoothly. Therefore, a signal charge that has been converted from the incident light and stored in the photodiode can be transferred to the transfer transistor completely. As a result, a solid-state imaging device that can operate efficiently even at a low voltage can be provided.

In this embodiment, it is preferable that the transfer transistor has a gate electrode formed on the semiconductor substrate, and the potential smoothing unit includes at least two diffusion layers formed in the semiconductor substrate, each of the diffusion layers having a different depth from a surface of the semiconductor substrate.

It is preferable that the at least two diffusion layers are formed below the gate electrode provided in the transfer transistor.

It is preferable that the potential smoothing unit includes a first pocket dissipation-diffusion layer and a second pocket dissipation-diffusion layer. The first pocket dissipation-diffusion layer is formed for dissipating a first pocket in which the potential from the photodiode to the transfer transistor plunges and the second pocket dissipation-diffusion layer is formed for dissipating a second pocket in which the potential plunges on a side of the transfer transistor with reference to the first pocket.

It is preferable that the first pocket dissipation-diffusion layer is formed at a position deeper than the second pocket dissipation-diffusion layer.

It is preferable that the potential smoothing unit further includes a barrier dissipation-diffusion layer that is formed for dissipating a barrier of the potential occurring between the first pocket and the second pocket.

It is preferable that the first pocket dissipation-diffusion layer is formed at a position deeper than the barrier dissipation-diffusion layer, and the barrier dissipation-diffusion layer is formed at a position deeper than the second pocket dissipation-diffusion layer.

It is preferable that the first pocket dissipation-diffusion layer, the barrier dissipation-diffusion layer and the second pocket dissipation-diffusion layer are composed of p-type impurity diffusion layers.

It is preferable that the first pocket dissipation-diffusion layer and the second pocket dissipation-diffusion layer are composed of p-type impurity diffusion layers, and the barrier dissipation-diffusion layer is composed of a n-type impurity diffusion layer.

It is preferable that an end of the first pocket dissipation-diffusion layer on a side of the photodiode is closer to the photodiode than to an end of the barrier dissipation-diffusion layer on a side of the photodiode, and the end of the barrier dissipation-diffusion layer on the side of the photodiode is closer to the photodiode than to an end of the second pocket dissipation-diffusion layer on a side of the photodiode.

It is preferable that the first pocket dissipation-diffusion layer is formed at a position of about 0.7 μm in depth from a surface of the semiconductor substrate.

It is preferable that the second pocket dissipation-diffusion layer is formed at a position shallower than a depth of about 0.2 μm from a surface of the semiconductor substrate.

It is preferable that the barrier dissipation-diffusion layer is formed at a position of about 0.4 μm in depth from a surface of the semiconductor substrate.

It is preferable that the photodiode includes: a shallow p-type photodiode diffusion layer formed in the semiconductor substrate; and a deep photodiode diffusion layer that is formed below the shallow p-type photodiode diffusion layer so as to be exposed from a portion of a surface of the semiconductor substrate that is located between the shallow p-type photodiode diffusion layer and the transfer transistor.

It is preferable that each of the plurality of pixel cells further includes: a floating diffusion layer that is formed for converting the signal charge read out from the photodiode by the transfer transistor into a voltage; a reset transistor that is formed for resetting the signal charge stored in the floating diffusion layer; and a source follower that is provided for amplifying a change in the voltage that is converted by the floating diffusion layer or converting an impedance.

It is preferable that the plurality of pixel cells are formed in a matrix form on the semiconductor substrate.

It is preferable that the driving unit includes: a vertical driving circuit for driving the plurality of pixel cells along a row direction; and a horizontal driving circuit for driving the plurality of pixel cells along a column direction.

According to the method for manufacturing a solid-state imaging device according to the present invention, in the step of forming the potential smoothing unit, an impurity is implanted at a region between a region where the photodiode is to be formed and a region where the transfer transistor is to be formed, the injection being carried out using three different levels of energy. Therefore, the thus formed potential smoothing unit allows a potential from the photodiode to the transfer transistor to change smoothly. Therefore, a signal charge that has been converted from the incident light and stored in the photodiode can be transferred to the transfer transistor completely. As a result, a solid-state imaging device that can operate efficiently even at a low voltage can be provided.

In this embodiment, it is preferable that the impurity implanted in the step of forming the potential smoothing unit includes an ion having a same conductivity type as that of the semiconductor substrate.

It is preferable that the step of forming the potential smoothing unit includes the steps of: forming a first pocket dissipation-diffusion layer for dissipating a first pocket in which the potential from the photodiode to the transfer transistor plunges; forming a barrier dissipation-diffusion layer on the first pocket dissipation-diffusion layer, the barrier dissipation-diffusion layer being formed for dissipating a barrier of the potential occurring between the first pocket and a second pocket; and forming a second pocket dissipation-diffusion layer on the barrier dissipation-diffusion layer, the second pocket dissipation-diffusion layer being formed for dissipating the second pocket in which the potential plunges on a side of the transfer transistor with reference to the first pocket.

It is preferable that the impurity is implanted using a first energy so as to form the first pocket dissipation-diffusion layer in the first pocket dissipation-diffusion layer formation step, the impurity is implanted using a second energy smaller than the first energy so as to form the barrier dissipation-diffusion layer in the barrier dissipation-diffusion layer formation step, and the impurity is implanted using a third energy smaller than the second energy so as to form the second pocket dissipation-diffusion layer in the second pocket dissipation-diffusion layer formation step.

It is preferable that the impurity is implanted under conditions of an acceleration voltage of 300 keV and a dose of $4.0 \times 10^{12}/cm^2$ in the first pocket dissipation-diffusion layer formation step, the impurity is implanted under conditions of an acceleration voltage of 100 keV and a dose of $8.0 \times 10^{11}/cm^2$ in the barrier dissipation-diffusion layer formation step and the impurity is implanted under conditions of an acceleration voltage of 10 keV and a dose of $4.0 \times 10^{11}/cm^2$ in the second pocket dissipation-diffusion layer formation step.

It is preferable that the impurity is a boron ion.

In the interline transfer CCD image sensor according this embodiment, the potential smoothing unit allows a potential from the photodiode to the transfer gate to change smoothly. Therefore, a signal charge that has been converted from the incident light and stored in the photodiode can be transferred to the transfer gate completely. As a result, an interline transfer CCD image sensor that can operate efficiently even at a low voltage can be provided.

Preferably, the interline transfer CCD image sensor according to this embodiment further includes vertical transfer CCDs that are arranged at predetermined intervals and along a vertical direction so as to be adjacent to the respective pixel cells that are arranged along a column direction, the vertical transfer CCDs being provided for transferring the signal charge read out from the photodiode by the transfer gate along the vertical direction.

The following describes an embodiment of the present invention, with reference to the drawings.

FIG. 1 is a circuit diagram showing a configuration of a solid-state imaging device 100 according to this embodiment.

The solid-state imaging device 100 includes a plurality of pixel cells 13 that are arranged in a matrix form on a semiconductor substrate 14. Each of the pixel cells 13 includes a photodiode 5 that converts incident light into a signal charge and stores the signal charge. In each of the pixel cells 13, a transfer transistor 6 for reading out the signal charge stored in the photodiode 5 is provided.

Each of the pixel cells 13 includes an amplify transistor 12. The amplify transistor 12 amplifies the signal charge read out by the transfer transistor 6. In each of the pixel cells 13, a reset transistor 11 is provided. The reset transistor 11 resets the signal charge read out by the transfer transistor 6.

The solid-state imaging device 100 includes a vertical driving circuit 15. A plurality of reset transistor control lines 111 are connected to the vertical driving circuit 15. The reset transistor control lines 111 are arranged parallel with each other at predetermined intervals and along a horizontal direction so as to be connected to the reset transistors 11 that are respectively provided in the pixel cells 13 arranged along the horizontal direction. A plurality of vertical select transistor control lines 121 further are connected to the vertical driving circuit 15. The vertical select transistor control lines 121 are arranged parallel with each other at predetermined intervals and along the horizontal direction so as to be connected to vertical select transistors that are provided respectively in the pixel cells 13 arranged along the horizontal direction. The vertical select transistor control lines 121 determine a row from which a signal is to be read out.

A source of each vertical select transistor is connected to a vertical signal line 61. A load transistor group 27 is connected to one end of each vertical signal line 61. The other end of each vertical signal line 61 is connected to a row signal storing portion 28. The row signal storing portion 28 includes a switching transistor for capturing signals from one row. A horizontal driving circuit 16 is connected to the row signal storing portion 28.

FIG. 2A is a cross-sectional view showing a configuration of the solid-state imaging device 100 according to this embodiment, and FIGS. 2B and 2C schematically show a change in potential from a photodiode to a transfer transistor, resulting from a potential smoothing layer provided in the solid-state imaging device according to this embodiment.

The photodiode 5 is a buried-type pnp photodiode that includes a shallow p-type photodiode diffusion layer 9 formed at a surface of a semiconductor substrate 14 and a deep photodiode diffusion layer 8 formed below the shallow p-type photodiode diffusion layer 9 so as to be exposed partially from the surface of the semiconductor substrate 14.

The transfer transistor 6 is formed adjacent to the photodiode 5 and has a gate electrode 7 formed on the semiconductor substrate 14. At a portion of the surface of the semiconductor substrate 14 that is on an opposite side of the photodiode 5 with reference to the transfer transistor 6, a floating diffusion layer 10 is formed. At a portion of the surface of the semiconductor substrate 14 that is on an opposite side of the transfer transistor 6 with reference to the floating diffusion layer 10, the reset transistor 11 is formed so as to have a gate electrode 23. At a portion of the surface of the semiconductor substrate 14 that is on an opposite side of the floating diffusion layer 10 with reference to the reset transistor 11, a power-supply diffusion layer 207 is formed. At each of the portions on an opposite side of the reset transistor 11 with reference to the power-supply diffusion layer 207 and on an opposite side of the transfer transistor 6 with reference to the photodiode 5, an element isolation potion 209 is formed.

In a portion of the semiconductor substrate 14 placed below the gate electrode 7 provided in the transfer transistor 6, a potential smoothing layer 1 is formed for allowing a potential from the photodiode 5 to the transfer transistor 6 to change smoothly.

The potential smoothing layer 1 includes a first pocket dissipation-diffusion layer 2; a second pocket dissipation-diffusion layer 3 and a barrier dissipation-diffusion layer 4. The first pocket dissipation-diffusion layer 2 is formed for dissipating a first pocket 17 in which the potential from the photodiode 5 to the transfer transistor 6 falls. The second pocket dissipation-diffusion layer 3 is formed for dissipating a second pocket 18 in which the potential plunges on a side of the transfer transistor 6 with reference to the first pocket 17. The barrier dissipation-diffusion layer 4 is formed for dissipating a barrier 19 of the potential occurring between the first pocket 17 and the second pocket 18.

The first pocket dissipation-diffusion layer 2 is formed at a position of about 0.7 μm in depth from the surface of the semiconductor substrate 14. The barrier dissipation-diffusion layer 4 is formed at a position of about 0.4 μm in depth from the surface of the semiconductor substrate 14. The second pocket dissipation-diffusion layer 3 is formed at a position shallower than a depth of about 0.2 μm from the surface of the semiconductor substrate 14.

In this way, the first pocket dissipation-diffusion layer 2 is formed at a position deeper than the barrier dissipation-diffusion layer 4, and the barrier dissipation-diffusion layer 4 is formed at a position deeper than the second pocket dissipation-diffusion layer 3.

The first pocket dissipation-diffusion layer 2, the barrier dissipation-diffusion layer 4 and the second pocket dissipation-diffusion layer 3 are composed of p-type impurity diffusion layers.

An end of the first pocket dissipation-diffusion layer 2 on a side of the photodiode 5 is closer to the photodiode 5 than to an end of the barrier dissipation-diffusion layer 4 on a photodiode 5 side. This is for dissipating the first pocket 17 more efficiently by making the photodiode-side end of the first pocket dissipation-diffusion layer 2 closer to a position 210 where the first pocket 17 occurs, which is located on a side of the photodiode 5 with reference to a position 211 where the barrier 19 occurs.

An end of the barrier dissipation-diffusion layer 4 on a side of the photodiode 5 is closer to the photodiode 5 than to an end of the second pocket dissipation-diffusion layer 3 on a photodiode 5 side. This is for dissipating the barrier 19 more efficiently by making the photodiode-side end of the barrier dissipation-diffusion layer 4 closer to a position 211 where the barrier 19 occurs, which is located on a side of the photodiode 5 with reference to a position 212 where the second pocket 18 occurs.

In the thus configured solid-state imaging device 100, the first pocket dissipation-diffusion layer 2 makes a potential at the first pocket 17 lower than a potential at the barrier 19 so that the first pocket 17 is dissipated. The barrier dissipation-diffusion layer 4 makes the potential at the barrier 19 higher so that the barrier 19 is dissipated. The second pocket dissipation-diffusion layer 3 makes a potential at the second pocket 18 lower so that the second pocket 18 is dissipated. As a result, the potential from the photodiode 5 to the transfer transistor 6 increases smoothly as shown in FIG. 2C.

Figure 3:
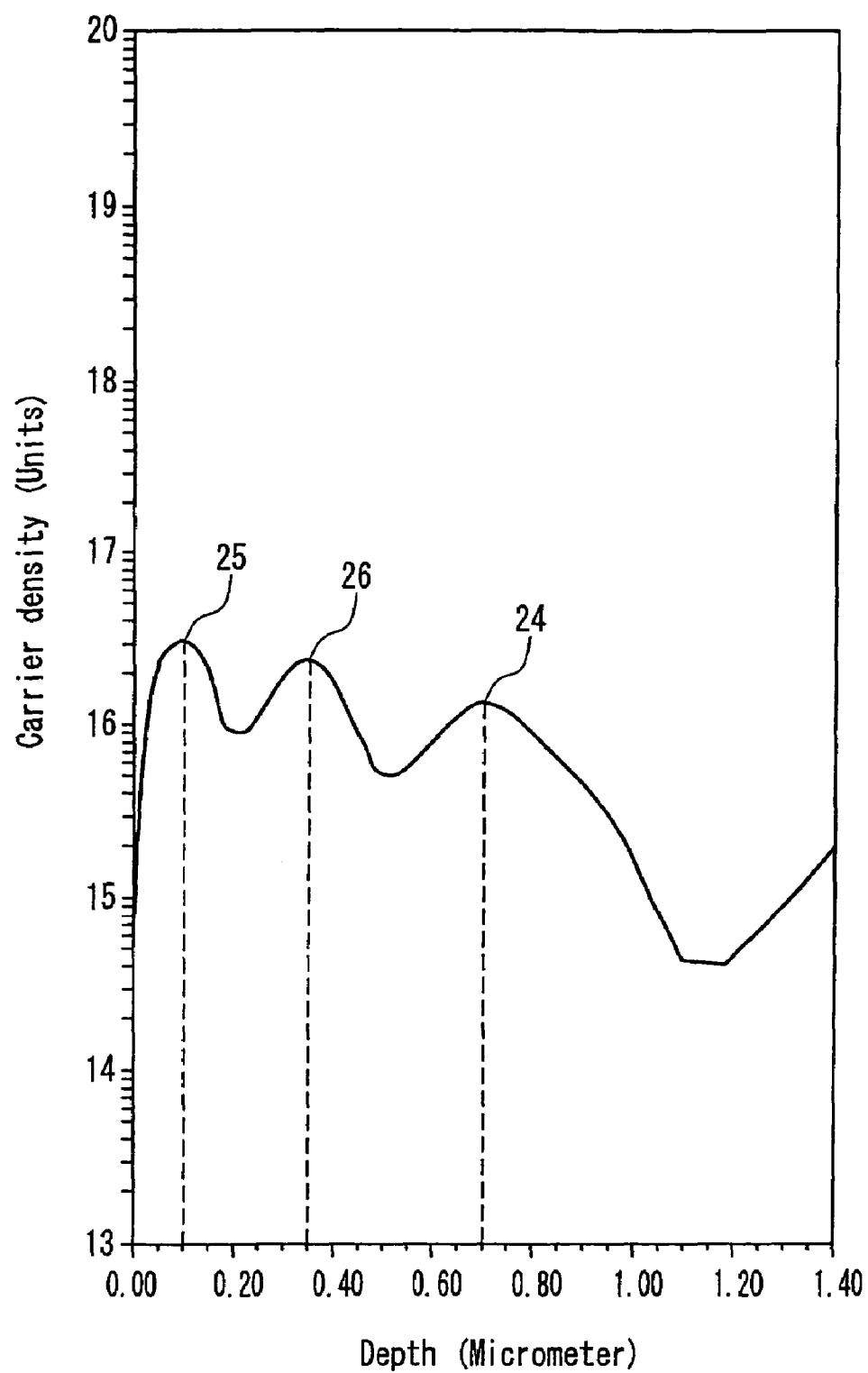
FIG. 3 is a graph showing a relationship between a depth of the potential smoothing layer provided in the solid-state imaging device according to this embodiment from the substrate surface and a carrier density.

The following describes a method for manufacturing the solid-state imaging device 100 according to this embodiment. FIG. 3 is a graph showing a relationship between a depth of the potential smoothing layer 1 provided in the solid-state imaging device 100 from the substrate surface and a carrier density. A horizontal axis of the graph indicates the depth of the potential smoothing layer 1 from the substrate surface and a vertical axis of the same indicates the carrier density of the potential smoothing layer 1.

Firstly, boron is implanted into the semiconductor substrate 14 under the conditions of an acceleration voltage of 300 keV and a dose of $4.0 \times 10^{12}/cm^2$, so as to form the first pocket dissipation-diffusion layer 2 in the semiconductor substrate 14. Next, boron is implanted to the semiconductor substrate 14 under the conditions of an acceleration voltage of 100 keV and a dose of $8.0 \times 10^{11}/cm^2$, so as to form the barrier dissipation-diffusion layer 4. Thereafter, boron is implanted to the semiconductor substrate 14 under the conditions of an acceleration voltage of 10 keV and a dose of $4.0 \times 10^{11}/cm^2$, so as to form the second pocket dissipation-diffusion layer 3.

Then, the photodiode 5 is formed adjacent to the thus formed first pocket dissipation-diffusion layer 2, the barrier dissipation-diffusion layer 4 and the second pocket dissipation-diffusion layer 3. Then, the transfer transistor 6 is formed above the first pocket dissipation-diffusion layer 2, the barrier dissipation-diffusion layer 4 and the second pocket dissipation-diffusion layer 3. Then, the reset transistor 11, the floating diffusion layer 10, the power-supply diffusion layer 207 and the element isolation portion 209 are formed.

In the thus manufactured potential smoothing layer 1 in the solid-state imaging device, as shown in FIG. 3, the first pocket dissipation-diffusion layer 2 having a carrier density shown by a peak 24 is formed at a position of 0.7 μm in depth in the semiconductor substrate 14 by a dose of $1.8 \times 10^{16}$ $cm^{-3}$. At a position of 0.35 μm in depth in the semiconductor substrate 14, the barrier dissipation-diffusion layer 4 having a carrier density shown by a peak 26 is formed by a dose of $2.5 \times 10^{16}$ $cm^{-3}$. At a position of 0.1 μm in depth in the semiconductor substrate 14, the second pocket dissipation-diffusion layer 3 having a carrier density shown by a peak 25 is formed by a dose of $3.0 \times 10^{16}$ $cm^{-3}$.

As stated above, according to this embodiment, the potential smoothing layer 1 allows the potential from the photodiode 5 to the transfer transistor 6 to change smoothly. Therefore, a signal charge stored in the photodiode 5 that has been converted from the incident light can be transferred to the transfer transistor 6 completely. As a result, a solid-state imaging device that can operate efficiently even at a low voltage can be provided.

Note here that although this embodiment shows an example where the first pocket dissipation-diffusion layer 2, the barrier dissipation-diffusion layer 4 and the second pocket dissipation-diffusion layer 3 are composed of p-type impurity diffusion layers, the present invention is not limited to such an example. For instance, the first pocket dissipation-diffusion layer 2 and the second pocket dissipation-diffusion layer 3 may be composed of p-type impurity diffusion layers and the barrier dissipation-diffusion layer 4 may be composed of a n-type impurity diffusion layer.

In addition, although this embodiment shows an example where the potential smoothing layer 1 is constituted with the three layers including the first pocket dissipation-diffusion layer 2, the barrier dissipation-diffusion layer 4 and the second pocket dissipation-diffusion layer 3, the potential smoothing layer 1 may be formed by adding a diffusion layer other than the first pocket dissipation-diffusion layer 2, the barrier dissipation-diffusion layer 4 and the second pocket dissipation-diffusion layer 3 so as to enhance a flexibility for controlling the potential.

Figure 4:
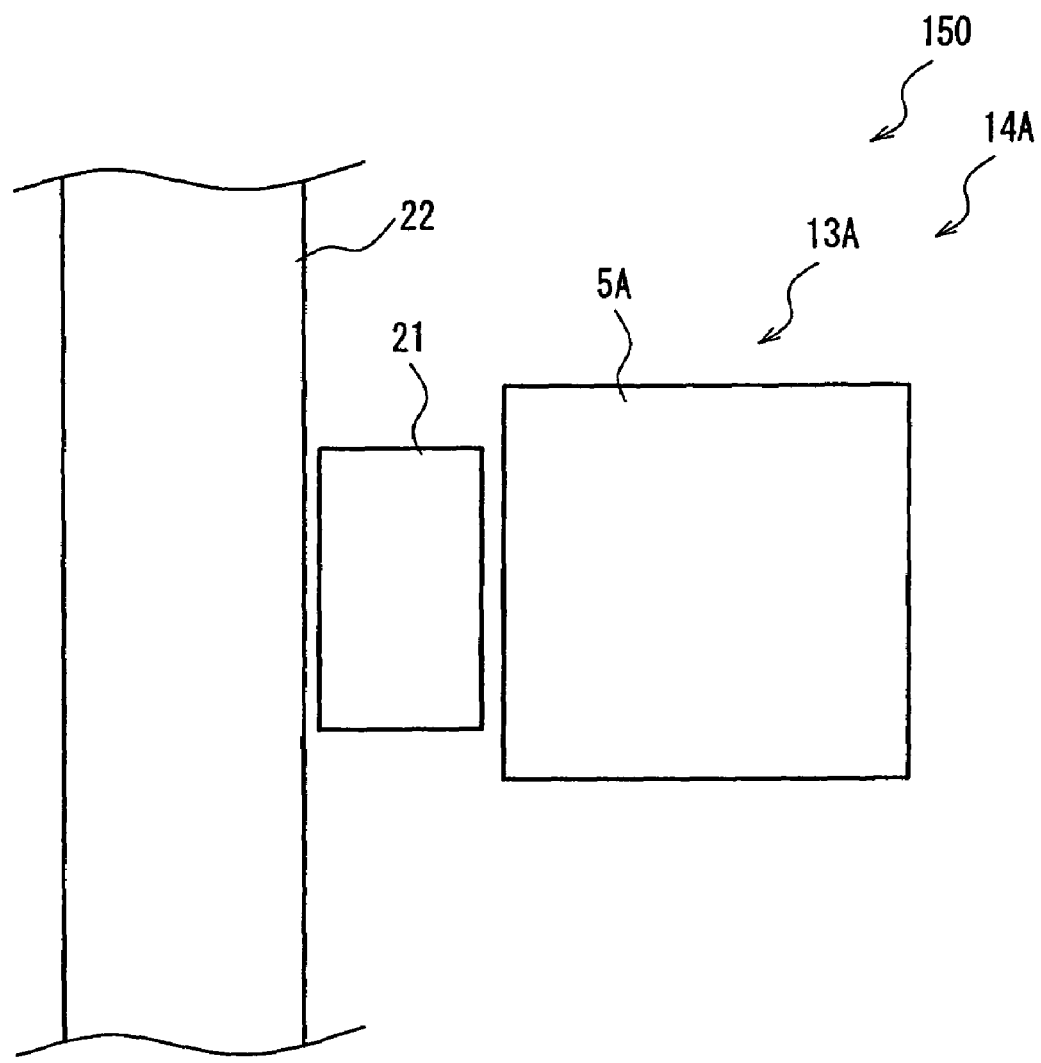
FIG. 4 is a plan view showing a configuration of an interline transfer CCD image sensor according to this embodiment.
Figure 5:
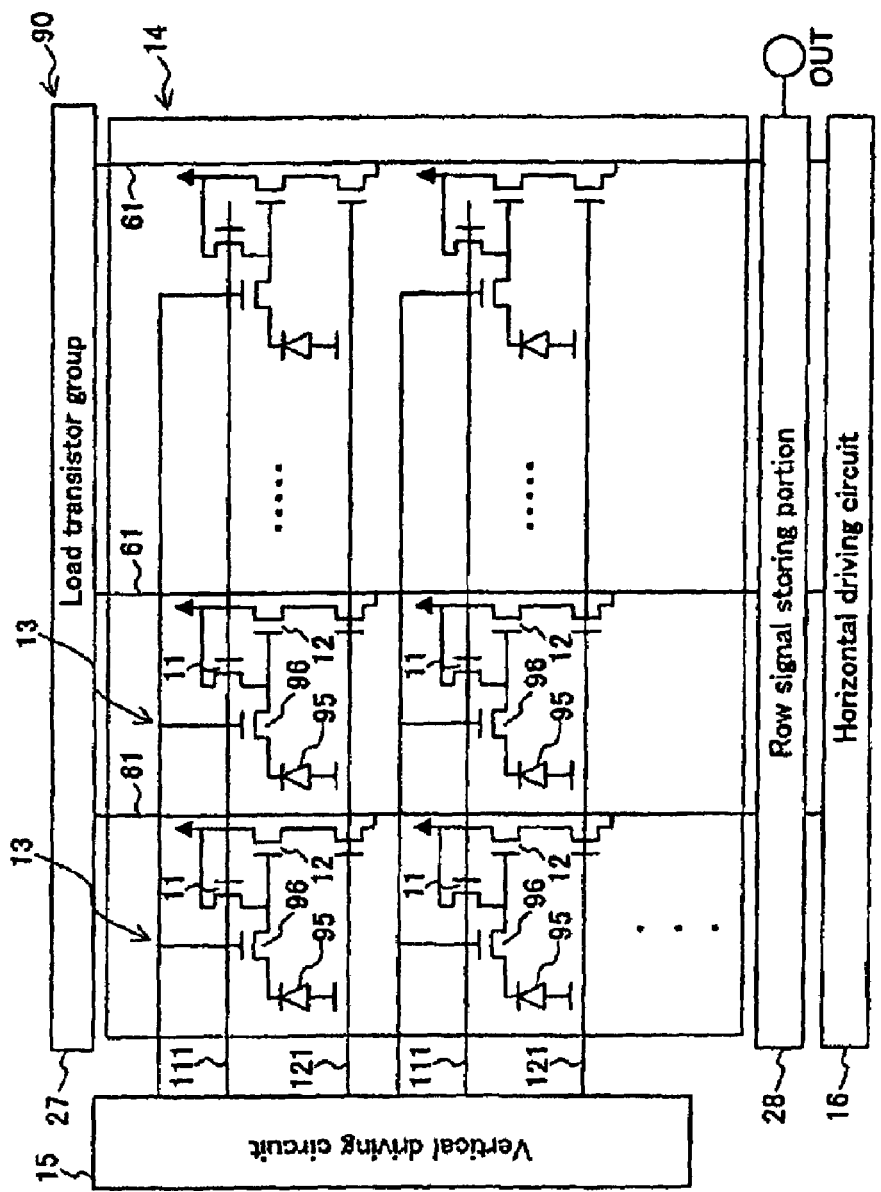
FIG. 5 is a circuit diagram showing a configuration of the conventional solid-state imaging device.
Figure 6:
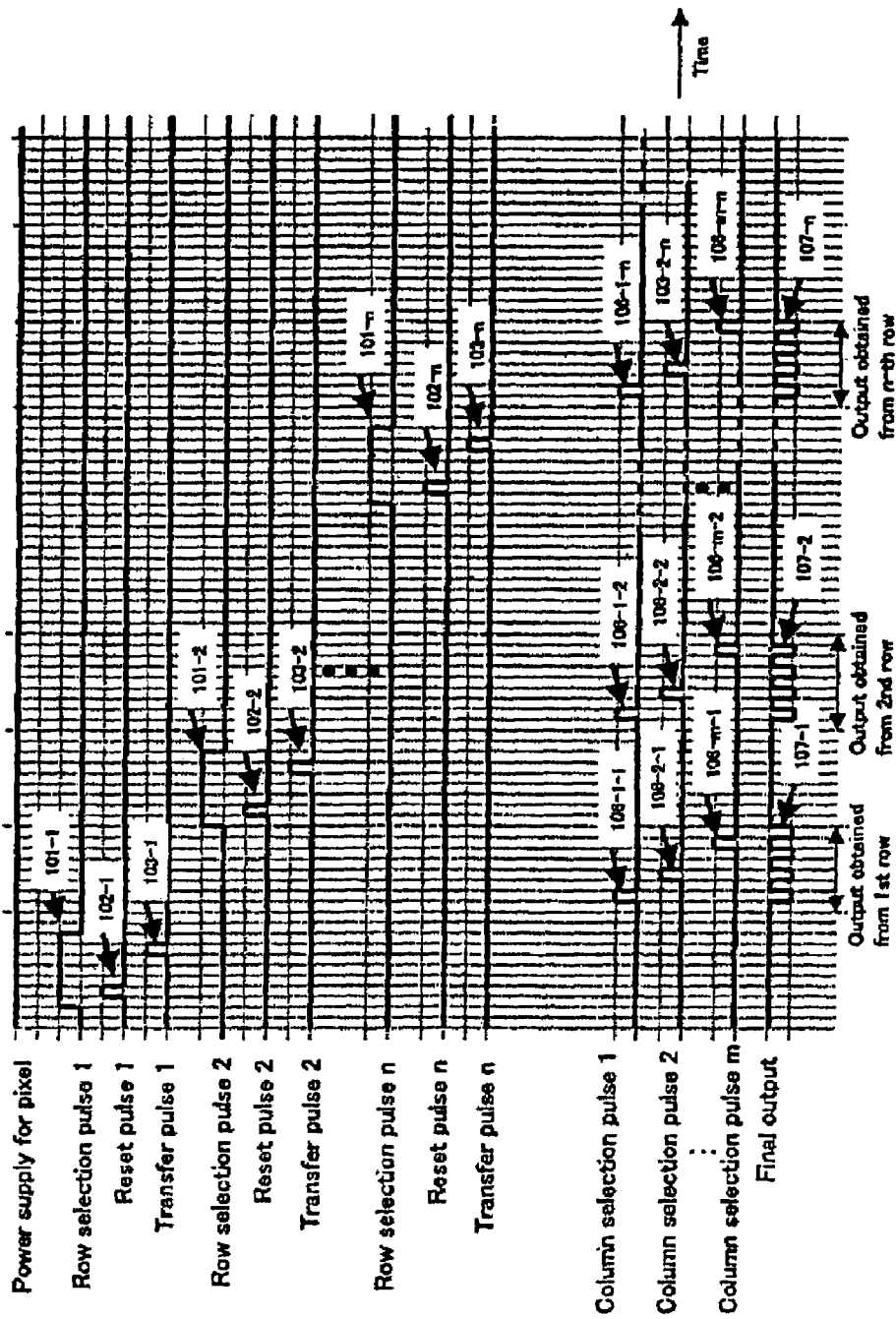
FIG. 6 is a timing chart for explaining an operation of the conventional solid-state imaging device.
Figures 7A, 7B, 7C:
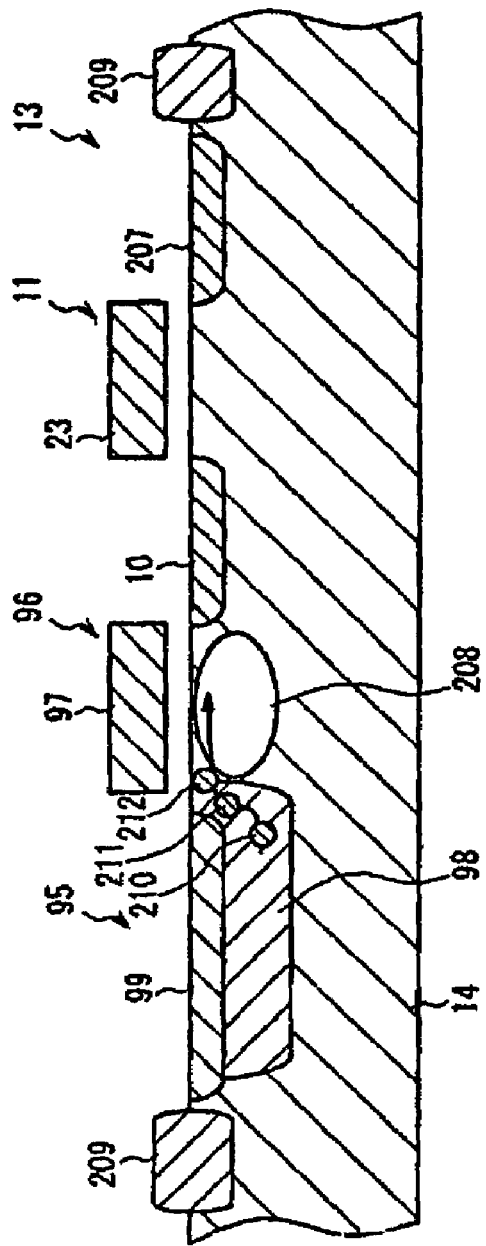
FIG. 7A is a cross-sectional view showing a configuration of the conventional solid-state imaging device, and FIGS.

FIG. 4 is a plan view showing a configuration of an interline transfer CCD image sensor 150 according to this embodiment. There has been a strong demand for lowering a voltage of a power supply even in the interline transfer CCD image sensor 150 operating at relatively high power-supply voltages. The present invention is applicable to such an interline transfer CCD image sensor 150.

The interline transfer CCD image sensor 150 includes a plurality of pixel cells 13A that are arranged in a matrix form on a semiconductor substrate 14A. Each of the pixel cells 13A includes a photodiode 5A that converts incident light into a signal charge and stores the signal charge. In each of the pixel cells 13A, a transfer gate 21 for reading out the signal charge stored in the photodiode 5A is provided.

The interline transfer CCD image sensor 150 is provided with vertical transfer CCDs 22 so as to transfer the signal charge read out from the photodiode 5A by each transfer gate 21 along a vertical direction. The vertical transfer CCDs 22 are arranged at predetermined intervals and along the vertical direction so as to be adjacent to the pixel cells 13A that are arranged along the vertical direction.

At a portion of the semiconductor substrate 14A below the transfer gate 21, a potential smoothing layer is formed for allowing a potential from the photodiode 5A to the transfer gate 21 to change smoothly.

The potential smoothing layer includes a first pocket dissipation-diffusion layer; a second pocket dissipation-diffusion layer and a barrier dissipation-diffusion layer. The first pocket dissipation-diffusion layer is formed for dissipating a first pocket in which the potential from the photodiode 5A to the transfer gate 21 falls. The second pocket dissipation-diffusion layer is formed for dissipating a second pocket in which the potential plunges on a side of the transfer gate 21 with reference to the first pocket. The barrier dissipation-diffusion layer is formed for dissipating a barrier of the potential occurring between the first pocket and the second pocket.

With the configuration similar to that described above, i.e., with the formation of the potential smoothing layer at a portion of the semiconductor substrate 14A below the transfer gate 21 that is formed between the photodiode 5A and the vertical CCD 22, the interline transfer CCD image sensor 150, in which a power-supply voltage is lowered, can be provided.

As stated above, according to the present embodiment, a solid-state imaging device, a method for manufacturing the same and an interline transfer CCD image sensor, by which a signal charge stored in a photodiode can be transferred completely even when a power supply voltage is low, can be provided.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device, comprising:
   a plurality of pixel cells arranged on a semiconductor substrate; and
   a driving unit that is provided for driving the plurality of pixel cells,
   wherein each of the plurality of pixel cells comprises:
      a photodiode that converts incident light into a signal charge and stores the signal charge;
      a transfer transistor that is provided for reading out the signal charge stored in the photodiode; and
      a potential smoothing unit that is formed so as to allow a potential from the photodiode to the transfer transistor to change smoothly,
      wherein the potential smoothing unit comprises at least three diffusion layers formed in the semiconductor substrate, each of the diffusion layers having a different depth from a surface of the semiconductor substrate.

2. The solid-state imaging device according to claim 1, wherein the at least three diffusion layers are formed below the gate electrode provided in the transfer transistor.

3. The solid-state imaging device according to claim 1, wherein the potential smoothing unit comprises a first pocket dissipation-diffusion layer and a second pocket dissipation-diffusion layer,
   wherein the first pocket dissipation-diffusion layer is formed for dissipating a first pocket in which the potential from the photodiode to the transfer transistor plunges and the second pocket dissipation-diffusion layer is formed for dissipating a second pocket in which the potential plunges on a side of the transfer transistor with reference to the first pocket.

4. The solid-state imaging device according to claim 3, wherein the first pocket dissipation-diffusion layer is formed at a position deeper than the second pocket dissipation-diffusion layer.

5. The solid-state imaging device according to claim 3, wherein the potential smoothing unit further comprises a barrier dissipation-diffusion layer that is formed for dissipating a barrier of the potential occurring between the first pocket and the second pocket.

6. The solid-state imaging device according to claim 5, wherein the first pocket dissipation-diffusion layer is formed at a position deeper than the barrier dissipation-diffusion layer, and
   the barrier dissipation-diffusion layer is formed at a position deeper than the second pocket dissipation-diffusion layer.

7. The solid-state imaging device according to claim 5, wherein the first pocket dissipation-diffusion layer, the barrier dissipation-diffusion layer and the second pocket dissipation-diffusion layer are composed of p-type impurity diffusion layers.

8. The solid-state imaging device according to claim 5,
   wherein the first pocket dissipation-diffusion layer and the second pocket dissipation-diffusion layer are composed of p-type impurity diffusion layers, and
   the barrier dissipation-diffusion layer is composed of a n-type impurity diffusion layer.

9. The solid-state imaging device according to claim 5,
   wherein an end of the first pocket dissipation-diffusion layer on a side of the photodiode is closer to the photodiode than to an end of the barrier dissipation-diffusion layer on a side of the photodiode, and
   the end of the barrier dissipation-diffusion layer on the side of the photodiode is closer to the photodiode than to an end of the second pocket dissipation-diffusion layer on a side of the photodiode.

10. The solid-state imaging device according to claim 3, wherein the first pocket dissipation-diffusion layer is formed at a position of about 0.7 µm in depth from a surface of the semiconductor substrate.

11. The solid-state imaging device according to claim 3, wherein the second pocket dissipation-diffusion layer is formed at a position shallower than a depth of about 0.2 µm from a surface of the semiconductor substrate.

12. The solid-state imaging device according to claim 5, wherein the barrier dissipation-diffusion layer is formed at a position of about 0.4 µm in depth from a surface of the semiconductor substrate.

13. The solid-state imaging device according to claim 1,
    wherein the photodiode comprises:
       a shallow p-type photodiode diffusion layer formed in the semiconductor substrate; and
       a deep photodiode diffusion layer that is formed below the shallow p-type photodiode diffusion layer so as to be exposed from a portion of a surface of the semiconductor substrate that is located between the shallow p-type photodiode diffusion layer and the transfer transistor.

14. The solid-state imaging device according to claim 1,
    wherein each of the plurality of pixel cells further comprises:
       a floating diffusion layer that is formed for converting the signal charge read out from the photodiode by the transfer transistor into a voltage;
       a reset transistor that is formed for resetting the signal charge stored in the floating diffusion layer; and
       a source follower that is provided for amplifying a change in the voltage that is converted by the floating diffusion layer or converting an impedance.

15. The solid-state imaging device according to claim 1, wherein the plurality of pixel cells are formed in a matrix form on the semiconductor substrate.

16. The solid-state imaging device according to claim 15,
    wherein the driving unit comprises:
       a vertical driving circuit for driving the plurality of pixel cells along a row direction; and a horizontal driving circuit for driving,the plurality of pixel cells along a column direction.

17. A method for manufacturing the solid-state imaging device according to claim 1, comprising the steps of:
forming the potential smoothing unit for allowing a potential from the photodiode to the transfer transistor to change smoothly;
forming the photodiode for converting the incident light into the signal charge and storing the signal charge, which is conducted after the step of forming the potential smoothing unit; and
forming the transfer transistor for reading out the signal charge stored in the photodiode,
which is conducted after the step of forming the photodiode,
wherein, in the step of forming the potential smoothing unit, an impurity is implanted at a region between a region where the photodiode is to be formed and a region where the transfer transistor is to be formed, the injection being carried out using three different levels of energy, so that at least three diffusion layers are formed in the semiconductor substrate, each of the diffusion layers having a different depth from a surface of the semiconductor substrate.

18. The method for manufacturing a solid-state imaging device according to claim 17, wherein the impurity implanted in the step of forming the potential smoothing unit comprises an ion having a same conductivity type as that of the semiconductor substrate.

19. The method for manufacturing a solid-state imaging device according to claim 18,
wherein the step of forming the potential smoothing unit comprises the steps of:
forming a first packet dissipation-diffusion layer for dissipating a first pocket in which the potential from the photodiode to the transfer transistor plunges;
forming a barrier dissipation-diffusion layer on the first packet dissipation-diffusion layer, the barrier dissipation-diffusion layer being formed for dissipating a barrier of the potential occurring between the first pocket and a second packet; and
forming a second packet dissipation-diffusion layer on the barrier dissipation-diffusion layer, the second pocket dissipation-diffusion layer being formed for dissipating the second pocket in which the potential plunges on a side of the transfer transistor with reference to the first pocket.

20. The method for manufacturing a solid-state imaging device according to claim 19,
wherein, in the first packet dissipation-diffusion layer formation step, the impurity is implanted using a first energy so as to form the first packet dissipation-diffusion layer,
in the barrier dissipation-diffusion layer formation step, the impurity is implanted using a second energy, that is less than the first energy, so as to form the barrier dissipation-diffusion layer, and
in the second pocket dissipation-diffusion layer formation step, the impurity is implanted using a third energy, that is less than the second energy, so as to form the second pocket dissipation-diffusion layer.

21. The method for manufacturing a solid-state imaging device according to claim 19,
wherein, in the first pocket dissipation-diffusion layer formation step, the impurity is implanted under conditions of an acceleration voltage of 300 keV and a dose of $4.0 \times 10^{12}/cm^2$, in the barrier dissipation-diffusion layer formation step, the impurity is implanted under conditions of an acceleration voltage of 100 keV and a dose of $8.0 \times 10^{11}/cm^2$, and in the second pocket dissipation-diffusion layer formation step, the impurity is implanted under conditions of an acceleration voltage of 10 keV and a dose of $4.0 \times 10^{11}/cm^2$.

22. The method for manufacturing a solid-state imaging device according to claim 17, wherein the impurity is a boron ion.

23. An interline transfer CCD image sensor, comprising:
a plurality of pixel cells arranged in a matrix form on a semiconductor substrate; and
a driving unit that is provided for driving the plurality of pixel cells,
wherein each of the plurality of pixel cells comprises:
a photodiode that converts incident light into a signal charge and stores the signal charge;
a transfer gate that is provided for reading out the signal charge stored in the photodiode; and
a potential smoothing unit that is formed so as to allow a potential from the photodiode to the transfer gate to change smoothly,
wherein the potential smoothing unit comprises at least three diffusion layers formed in the semiconductor substrate, each of the diffusion layers having a different depth from a surface of the semiconductor substrate.

24. The interline transfer CCD image sensor according to claim 23, further comprising vertical transfer CCDs that are arranged at predetermined intervals and along a vertical direction so as to be adjacent to the respective pixel cells that are arranged along the vertical direction, the vertical transfer CCDs being provided for transferring the signal charge read out from the photodiode by the transfer gate along the vertical direction.

* * * * *